CATHANODE OUTPUT BRIDGE AMPLIFIER

Filed Feb. 17, 1955

INVENTOR.
RONALD J. ROCKWELL.
BY Alden D. Redfield.
Norman J. O'Malley.
ATTORNEYS.

CATHANODE OUTPUT BRIDGE AMPLIFIER

Filed Feb. 17, 1955

INVENTOR.
RONALD J. ROCKWELL.
BY Alden D. Redfield
Norman J. O'Malley
ATTORNEYS.

Dec. 24, 1957 R. J. ROCKWELL 2,817,718

CATHANODE OUTPUT BRIDGE AMPLIFIER

Filed Feb. 17, 1955 3 Sheets-Sheet 3

INVENTOR.
RONALD J. ROCKWELL
BY Alden D. Redfield
Norman J. O'Malley
ATTORNEYS.

United States Patent Office 2,817,718
Patented Dec. 24, 1957

2,817,718

CATHANODE OUTPUT BRIDGE AMPLIFIER

Ronald J. Rockwell, Cincinnati, Ohio, assignor to Crosley Broadcasting Corporation, Cincinnati, Ohio, a corporation of Ohio Application February 17, 1955, Serial No. 488,776

8 Claims. (Cl. 179—171)

This invention relates generally to electronic amplifiers and more specifically to electronic audio amplifiers capable of reproducing a signal with exceptionally high fidelity.

Conventional audio amplifiers of the push-pull circuit type, when designed to reproduce a signal with minimum distortion, invariably require the use of an expensive, high quality output transformer characterized by its negligible leakage reactance and small distributed capacitance.

Though the direct current flowing in the two push-pull tubes may be balanced to avoid core saturation, in conventional circuitry it is allowed to circulate through the output transformer primary and thus, when either of the tubes is cut off, as they must be during each signal cycle if operating class B, the transformer sees a collapsing current which generates a transient or parasitic oscillation in the output wave form having amplitude and frequency characteristics related to the amount of leakage reactance present. Also, since the primary winding is connected between the anodes of the two push-pull tubes, its impedance forms the anode load and, therefore, must be relatively high. This makes it difficult to avoid high frequency signal loss due to excessive distributed capacitance in the windings.

It is an object of this invention to provide an amplifier wherein, under balanced conditions, the direct current circulating in the output stage does not flow through the output load.

It is a further object of this invention to provide an amplifier having a bridge type output stage with a resistance coupled between the output stage tubes in such manner that, under unbalanced conditions, the output stage circulating direct current flowing through the resistance tends to restore balance by supplying a biasing voltage which increases direct current flow in the low current tube and decreases direct current flow in the high current tube.

It is a still further object of this invention to provide an output circuit which substantially avoids transient distortion in the output transformer due to switching currents, without relying upon negligible transformer leakage reactance.

It is still a further object of this invention to provide an amplifier having an output stage which provides controllable speaker damping and which is capable of being coupled to an output transformer having a relatively low primary winding impedance.

Figure 1:
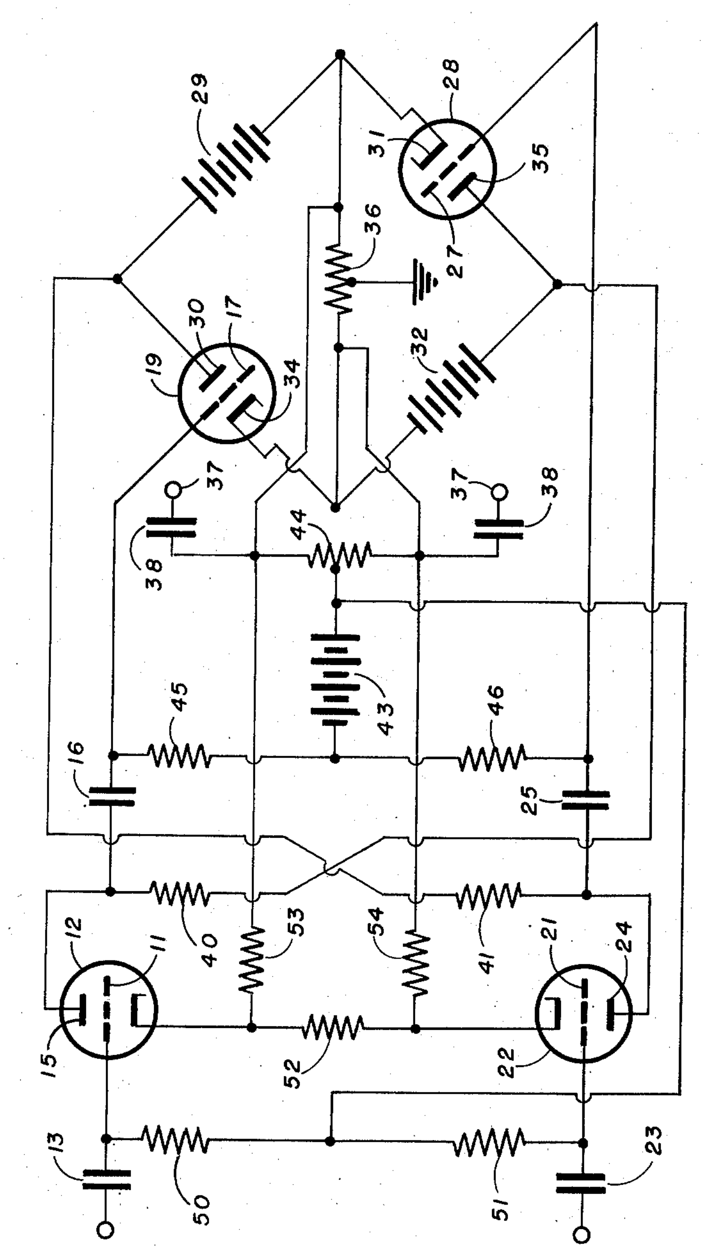
Figure 2:
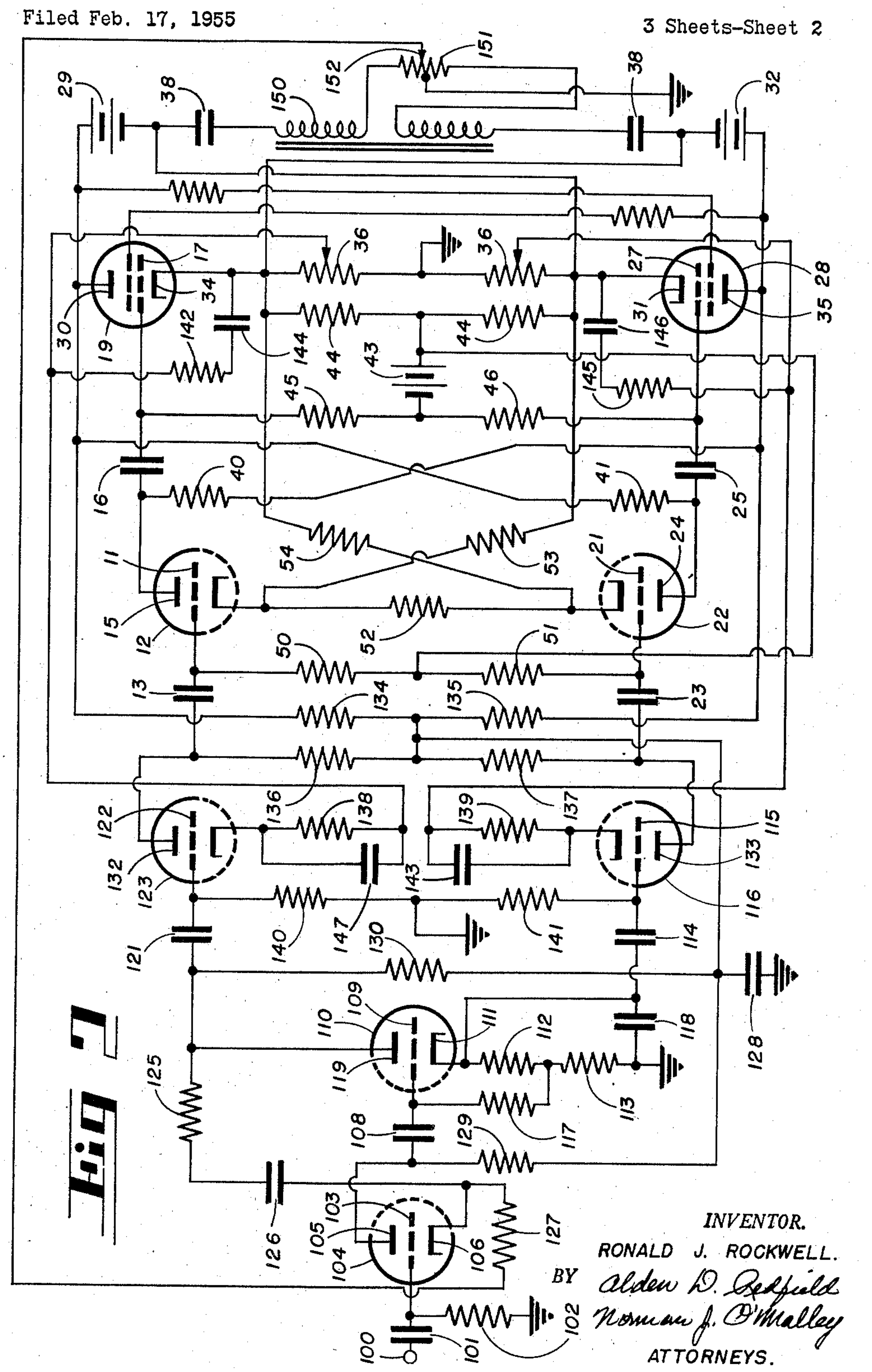
Figure 3:
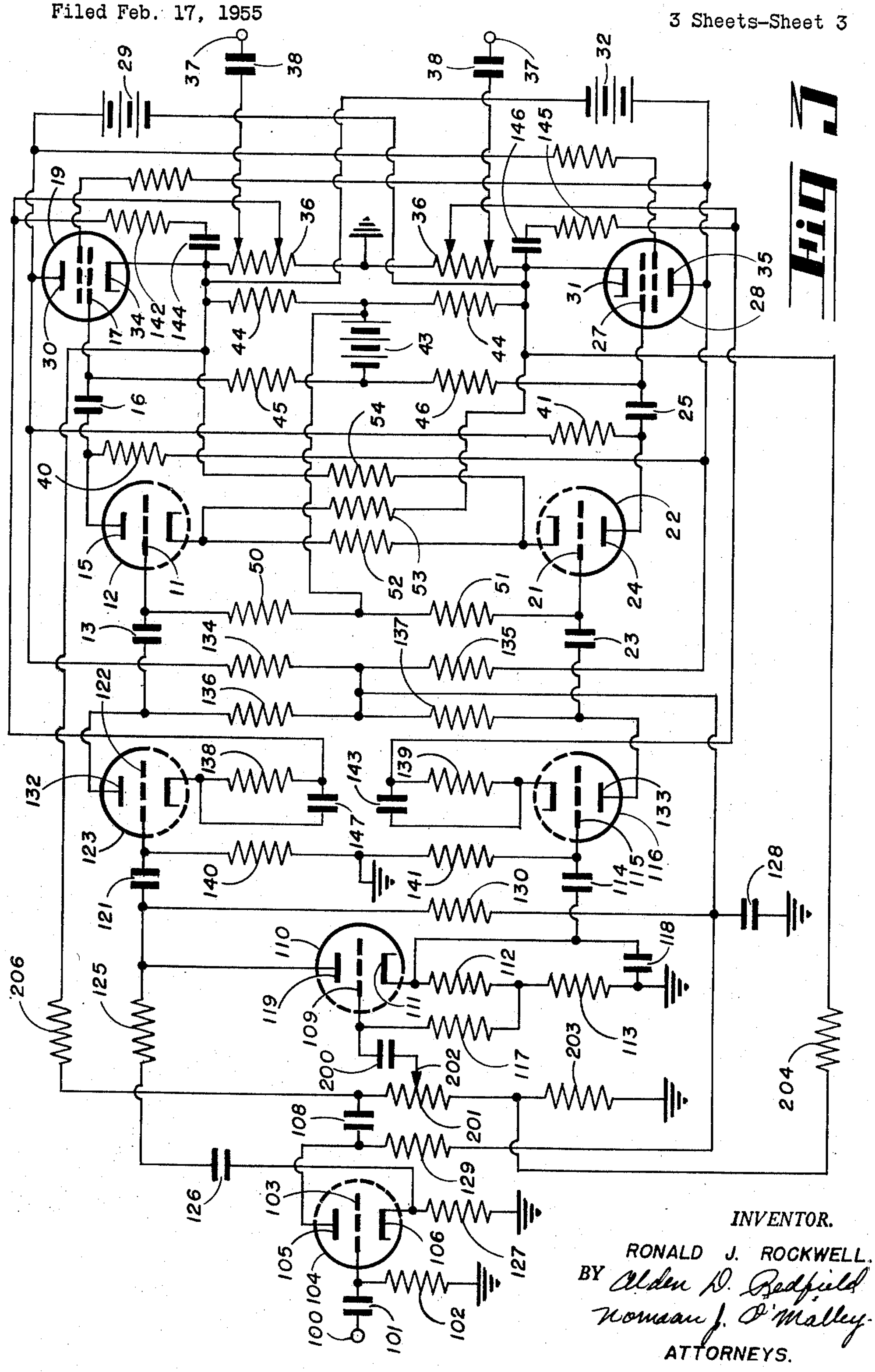

For a better understanding of the present invention, together with other and further objects, advantages and capabilities thereof, reference is made to the following disclosure and appended claims in connection with the accompanying drawings in which:

Fig. 1 is a schematic circuit diagram of the final driver stage and output stage; and Fig. 2 is a circuit diagram of the preferred embodiment of the amplifier, and Fig. 3 is a modification of the circuit of Fig. 2.

Briefly, the invention comprises a plural stage amplifier using both regenerative and degenerative feedback in conjunction with two output tubes connected as opposite diagonals of a bridge, each with its own separate power supply making up the two remaining bridge diagonals. A bias compensating resistance under balanced conditions, by virtue of its connection across the bridge, remains outside of the path of the direct current circulating through the output tubes around the bridge diagonals, and by virtue of its relatively high resistance, tends to maintain direct current balance. Each output tube is driven by a separate driver tube having an anode regeneratively and a cathode degeneratively coupled to the output stage, and current feedback, either regenerative or degenerative, is used to control the effective output impedance for speaker damping.

In the circuit of Fig. 1, I have shown the output and last driver tube stage in such manner as to emphasize the bridge arrangement. There it can be seen that the grid 11 of driver tube 12 is supplied with a signal which is fed through capacitor 13, and the anode 15 is coupled through capacitor 16 to feed the signal to grid 17 of output tube 19.

Symmetrically, the grid 21 of driver tube 22 is coupled to the signal source through capacitor 23 to provide an amplified signal at anode 24, which is coupled through capacitor 25 to the grid 27 of output tube 28. The power source 29, diagrammatically shown as a battery but not necessarily limited thereto, is coupled between the anode 30 of output tube 19 and the cathode 31 of output tube 28. A second and separate power source 32, also merely diagrammatically shown as a battery, is coupled between the cathode 34 of output tube 19 and anode 35 of output tube 28. A bias compensating resistance 36 is coupled between cathode 34 of output tube 19 and cathode 31 of output tube 28 and to output terminals 37 through coupling capacitors 38.

Anode 15 of driver tube 12 is regeneratively coupled through anode resistance 40 to anode 35 of output tube 28. In similar manner, anode 24 of driver tube 22 is regeneratively coupled through anode resistance 41 to anode 30 of output tube 19.

A bias source 43 is coupled between center-tapped resistance 44 and the junction of resistors 45 and 46 to supply bias potential for the two output tubes 19 and 28. Driver tube 12 and driver tube 22 are self-biased through a symmetrical circuit, including resistors 50, 51, 52, 53 and 54, along with center-tapped resistor 44. As will be brought out in greater detail, these bias connections supply a slightly degenerative feedback for distortion correction purposes.

Circuit operation can be understood best by first considering operation of the driver tube and output stage, as shown in Fig. 1. Driver tubes 12 and 22 are biased for approximately class A operation, while output tubes 19 and 28 are biased to almost plate current cutoff. Under quiescent signal conditions, because of circuit symmetry it can be seen that the same electron current flows through driver tubes 12 and 22, if it be assumed that these two tubes have similar characteristics. For example, starting with the positive terminal of power source 32, the direct current signal path may be traced through plate resistance 40, the anode 15-cathode path of driver tube 12 through self-biasing resistance 53 to the negative terminal of power source 29. Continuing, the circuit may be further traced through power source 29, plate resistance 41, the anode 24-cathode path of driver tube 22 and through self-biasing resistance 54 back to the negative terminal of power source 32. There is no direct current conduction through resistances 36, 44 and 52, since they are connected between equal voltage points under balanced conditions.

Again, assuming that output tube 19 has characteristics similar to output tube 28 and that power source 29 supplies substantially the same voltage as power source 32, it can be seen that under quiescent signal conditions, direct current circulates around the bridge diagonals and not through bias compensating resistance 36. Actually, the anode-cathode path of driver tube 12 is in parallel with the anode-cathode path of output tube 28, and the anode-cathode path of driver tube 22 is in parallel with the anode-cathode path of output tube 19.

Operation of the circuit of Fig. 1 under signal conditions can be readily understood if it be assumed that the signal applied to grid 11 of driver tube 12 is just starting a positive going excursion and the reversed polarity counterpart signal applied to grid 21 of driver tube 22 is just starting a negative going signal excursion. The resulting amplified positive signal excursion on the grid 27 of output tube 28 increases electron conduction through the anode 35-cathode 31 path. At the same time, the negative signal excursion on anode 15 of driver tube 12 is impressed through coupling capacitor 16 on the grid 17-cathode 34 circuit of output tube 19.

The reduced electron current flow between anode 30 and cathode 34 of output tube 19 and the increased current flow between anode 35 and cathode 31 of output tube 28 unbalances the bridge, and when the negative signal excursion on grid 17 drives output tube 19 to cutoff, all of the current flowing through output tube 28 passes through bias compensating resistance 36, and the circuits connected in parallel therewith. As a result, the potential on the cathode 31 of output tube 28 is raised relative to ground. Though this has a degenerative effect, it is compensated for, at least in part, by regenerative feedback from the bias compensating resistance 36 to the plate circuit of driver tube 22. This arises from the connection of the cathode of driver tube 22 through resistance 54 to what, at this instant, is the negative side of resistance 36. Thus, the plate circuit of driver tube 22 includes not only the voltage of power supply 29, but also the voltage across bias compensating resistance 36 coupled in aiding polarity. As a result, the anode voltage of driver tube 22 increases to compensate for the abnormally high grid drive required on tube 28, due to its cathode degeneration.

The value of resistance 52, which is coupled between the cathodes of driver tubes 12 and 22, controls the amount of degenerative feedback to these tubes from the output stage. Thus, when the cathode 31 side of bias compensating resistor 36 is driven positive relative to ground, due to increased conduction in output tube 28, a slight positive voltage relative to ground is fed back to the cathode of driver tube 12, and a slight negative voltage is fed back to the cathode of driver tube 22.

When the polarity of the input signal changes so that the signal applied to grid 11 of driver tube 12 is just starting a negative going excursion and the reversed polarity counterpart signal applied to grid 21 of driver tube 22 is just starting a positive going signal excursion, the polarity of the output signal across resistance 36 also reverses.

The amplified positive signal excursion on the anode of driver tube 12, being impressed across the grid 17-cathode 34 circuit of output tube 19, drives this tube into increased conduction at the same time that the negative going signal excursion taken from anode 24 of driver tube 22 drives output tube 28 towards cutoff. Again, the bridge is unbalanced, and the current flowing through output tube 19 drives the cathode 34 side of bias compensating resistance 36 positive relative to ground and the cathode 31 side of resistance 36 negative relative to ground. All feedback polarities reverse in similar manner with the positive signal excursion across resistance 36 adding to the voltage of power source 32 so as to regeneratively increase the potential at the anode of driver tube 12. At the same time the degenerative feedback voltage coupled to the cathodes of the driver tube stage, which is impressed across resistance 52, reverses in polarity so that the cathode of driver tube 12 sees a negative voltage excursion at the same time that the cathode of driver tube 22 sees a positive voltage excursion.

Explanation of circuit operation up to this point has assumed existence of balanced conditions, i. e., that both tubes in the driver stage have similar characteristics and that both tubes in the output stage have similar characteristics. Also, it is assumed that power sources 29 and 32 are similar and that the various resistances shown in the upper half of Fig. 1 are counterparts of resistances shown in the lower half of the circuit. In actual practice such symmetry can be obtained by a careful choice of circuit components, with resulting optimum amplifier performance. As for the tubes, however, even though they are carefully selected for specific characteristics, after aging, some unbalance is bound to occur.

As this unbalanced condition starts to appear, the circuit functions in such manner as to effectively overcome the unbalance and maintain sufficient balance for successful high fidelity operation. This can be seen in the circuit of Fig. 1, if it be assumed that the signal is quiescent and that the two output tubes used are normally unbalanced as to plate currents with tube 19 drawing more current than tube 28.

Since there is a greater electron flow through the bridge diagonal including output tube 19 than there is in the bridge diagonal including output tube 28, the difference between the diagonal currents must flow through bias compensating resistance 36. The polarity of the resulting voltage across resistance 36 is such as to make the cathode 34 of output tube 19 positive relative to ground and the potential of cathode 31 of output tube 28 negative relative to ground. Resistance 44, which is connected in parallel with resistance 36, has this same voltage impressed across its terminals with the cathode 34 side of resistance 44 being positive relative to its center tap and also to the resistance terminal connected to cathode 31. Tracing the grid-cathode circuit of output tube 19 from cathode 34 through the lower portion of resistance 44, it can be seen that the resulting voltage drop across the lower portion of resistance 44 acts to bias output tube 19 closer to cutoff, thereby reducing electron flow in its anode 30-cathode 34 internal path. Also, it can be seen that the voltage drop across the upper portion of resistance 44 is impressed between the grid 27 and cathode 31 of output tube 28. This voltage drop or resulting bias voltage tends to increase conduction between anode 35 and cathode 31 of output tube 28, thereby bringing the bridge back toward a balanced condition where little, if any, direct current flows through resistance 36. It now can be seen that the bias compensating effect depends on the value of resistance 36 and that there would be no compensation if a low resistance transformer primary were used in place of bias compensating resistance 36.

Not only is the strongly conducting tube biased back closer to cutoff, but also the weakly conducting tube is forced to greater conduction, thereby tending to restore or maintain balanced conditions. Tests show that inherent unbalance in output tubes can be reduced by a ratio of approximately 10 to 1.

The preferred embodiment of a practical amplifier embodying the bridge type driver and output stage of Fig. 1 is shown in Fig. 2, where circuit elements common to both figures are identified by the same reference numerals as used in Fig. 1. Input terminal 100 is assumed to be connected to a single-ended output signal source, not shown. The signal is coupled through capacitor 101 and grid leak resistor 102 to grid 103 of amplifier 104, having an anode 105 and a cathode 106. An amplified and inverted version of the input signal is taken from the anode 105 and fed through coupling capacitor 108 to the grid 109 of paraphase or phase-splitting amplifier 110. One output is taken from cathode 111 across resistances 112 and 113 and fed through coupling capacitor 114 to the control grid 115 of amplifier 116. Paraphase amplifier 110 can be self-biased by use of a resistance 117 connected from grid 109 to the junction of cathode resistances 112 and 113. Capacitor 118 acts as a bypass at high frequencies and supplies a slight signal phase shift correction. The phase-inverted counterpart signal is taken from anode 119 and fed through coupling capacitor 121 to the control grid 122 of amplifier 123. Resistance 125 and capacitor 126, in conjunction with resistance 127 in the cathode circuit of input amplifier 104, act as a local negative voltage feedback path used to clean up the output of paraphase amplifier 110. Anode voltage for amplifiers 104 and 110 is taken from across filter capacitor 128, being connected to anode 105 through anode resistance 129 and to anode 119 through anode resistance 130.

The output from amplifier 123 is taken from anode 132 through coupling capacitor 13 to grid 11 of driver tube 12, which is the first driver stage shown in Fig. 1. The output of amplifier 116 is taken from anode 133 through coupling capacitor 23 to grid 21 of driver tube 22. Power sources 29 and 32 act to supply anode voltage for all of the tubes in the amplifier. The voltage across filter capacitor 128, which supplies anode voltage to tubes 104 and 110, is taken from the junction of resistances 134 and 135, each of which is connected to the positive terminal of one of the two power sources in such manner as to essentially buck out all audio that appears on the power sources. The direct current return path for amplifiers 104 and 110 is through ground and center-tapped resistance 36 back to power sources 29 and 32. Amplifiers 123 and 116 are also supplied by the voltage across filter capacitor 128 through anode resistances 136 and 137, respectively. The direct current return path for amplifier 123 is through cathode resistance 138 and a tap near ground on the upper portion of resistance 36, while the direct current return path for amplifier 116 is through cathode resistance 139 and a tap near ground on the lower half of resistance 36. Grids 122 and 115 of amplifiers 123 and 116 are coupled to ground through resistance 140 and 141, respectively. Capacitors 147 and 143 in the cathode circuits of these amplifiers act as conventional bypass capacitances. The filter network comprising resistance 142 and capacitor 144 in the cathode circuit of output tube 19 and the filter network comprising resistance 145 and capacitor 146 in the cathode circuit of output tube 28 act to provide high frequency compensation.

Output transformer primary 150 has a split winding between which is connected a center-tapped potentiometer 151. Slider 152 is connected back to the cathode 106 of input tube 104 to supply a feedback voltage proportional to the output load current. When the slider 152 is in the position shown in Fig. 2, i. e., off-center in the direction of power source 29, feedback is regenerative. When the slider is moved very close to or on the ground center tap there is no feedback, and if the slider is moved toward the power source 32 side of the potentiometer 151, feedback is degenerative.

In light of the detailed explanation of operation of the two amplifier stages shown in Fig. 1, explanation of circuit operation of a preferred embodiment of the amplifier, as shown in Fig. 2, can be relatively brief. Assuming that an audio signal is supplied from a single-ended source, not shown, and fed to amplfier input terminal 100, it can be seen that the positive signal excursion on grid 103 results in a negative signal excursion on the grid 109 of paraphase amplifier 110. The inphase negative signal excursion on cathode 111 of amplifier 110 is impressed on grid 115 of first driver stage tube 116, while the inverted version of this signal is fed through coupling capacitor 121 as a positive signal excursion on grid 122 of amplifier 123. The push-pull output of the first driver stage is fed through coupling capacitors 13 and 23 to drive the final driver stage comprising tubes 12 and 22, grid 11 going negative and grid 21 of tube 22 going positive.

The resulting positive signal excursion on the anode 15 of final driver stage tube 12 is fed through coupling capacitor 16 to grid 17 of output tube 19, driving the anode 30-cathode 34 path into greater conduction and the bridge into unbalance. At the same time, grid 27 of output tube 28 sees a negative signal excursion tending to cut off conduction between anode 35 and cathode 31, thereby further unbalancing the bridge and allowing all of the current passing through output tube 19 to flow through resistor 36 and circuits in parallel therewith after output tube 28 is cut off. The voltage drop across resistor 36, in turn, causes current to flow through output transformer 150 from its lower terminal up through potentiometer 151, the upper winding of primary 150 back to the negative terminal of power source 29. The voltage drop between slider 152 and the ground tap, which is fed to the input, is polarized so as to make the cathode 106 of input tube 104 go further negative in regenerative action. Since potentiometer 151 is in series with the current flowing in the primary 150 of the output transformer, any voltage drop taken from across potentiometer 151 and fed back to the single-ended input of the amplifier acts as a current feedback regulating the output current.

During the negative signal excursion on input terminal 100, paraphase amplifier 110 and the first and second driver stages act to impress a negative going signal on grid 17 of output tube 19 and a positive going signal on grid 27 of output tube 28. Again, the bridge is unbalanced and all of the current passing through output tube 28 from power source 32 passes through resistor 36 and its parallel circuits, which include the output transformer, after the negative signal excursion on grid 17 of output tube 19 drives through cutoff. The voltage drive across resistor 36 causes current to flow through output transformer 150 from its upper terminal down through potentiometer 151, the lower winding of the primary winding 150 and back to the negative terminal of power source 32. If slider 152 is as shown in Fig. 2, the current feedback is also regenerative on this portion of the signal cycle. However, if slider 152 is moved to the lower half of potentiometer 151, the feedback is degenerative. Thus, the position of the slider 152 controls the amplitude and polarity of the feedback, and once positioned for either regenerative or degenerative feedback, acts independently of the polarity of the input signal excursion.

The type of feedback used is important in that it governs the effective amplifier output impedance. To begin with, it is well known that feedback circuits can be divided into two general types: (1) those in which the feedback voltage is derived directly from the output voltage, or a voltage feedback type, and (2) those in which the feedback voltage is derived from the current flowing in the output, or a current feedback type. As has been stated, the feedback voltage taken from slider 152 is a current feedback voltage in that the voltage fed back is proportional to the load current through primary winding 150.

Degenerative or negative voltage feedback tends to lower the effective output impedance of an amplifier, while positive or regenerative voltage feedback tends to raise the effective output impedance. On the other hand, positive or regenerative current feedback tends to lower the effective output impedance, and negative or degenerative current feedback tends to raise the effective output impedance. Thus, by adjusting slider 152, it is possible to vary the effective output imepdance from a high positive value through zero to a point where the output acts as a negative impedance source.

When the amplifier is to be used with an audio transducer or loud speaker, it is usually desirable to adjust slider 152 for positive or regenerative current feedback so that the source impedance presented to the loud speaker driving element is negative. Such a negative source impedance acts to dampen the loud speaker and greatly reduce ringing. Optimum results should be expected when the effective source impedance of the amplifier is adjusted to have a negative value which substantially equals the impedance of the loud speaker coil. Then the amplifier acts essentially as a constant-voltage generator, driving a resistive load with almost perfect damping. Any frequency-dependent fall-off in output can be minimized by pre-amplifier boost circuitry.

The circuit of Fig. 2 contemplates the use of an output transformer. By a slight change in the circuit arrangement, it is possible to make the use of an output transformer entirely optional. Such a circuit is shown in Fig. 3, using the same reference numerals, wherever applicable, as are used in the circuit shown in Fig. 2.

As can be seen, a feedback connection has been added between amplifiers 104 and 110. Grid 109 of amplifier 110 is coupled back to the output of amplifier 104 through capacitor 200 and potentiometer 201. Potentiometer slider 202 controls the amplitude and polarity of the feedback signal used, as well as the amplitude of the signal taken from the output of amplifier 104, making the amplifier output amplitude independent of the position of slider 202. The lower terminal of potentiometer 201 is coupled to ground through resistance 203 and also back to cathode 31 of output tube 28 through resistance 204. The other end of potentiometer 201 is coupled back through resistance 206 to the cathode 34 of output tube 19. Instead of taking the output of the amplifier directly from the cathodes of the output tubes, the output circuit is tapped down on both ends of resistance 36, as shown. The resulting voltage drop across each outside end of resistor 36 thus supplies a load current proportional feedback signal which is impressed through resistances 204 and 206 back to potentiometer 201 in the input circuit of paraphase amplifier 110.

By adjusting slider 202 of potentiometer 201 from one side to the other, it is possible to vary the polarity of the current feedback from positive to negative. Thus, as brought out in connection with the circuit of Fig. 2, the effective output impedance of the amplifier can be made either positive or negative as desired. The circuit of Fig. 3 has advantages in that adjustment of potentiometer slider 202 does not affect overall circuit gain as does adjustment of the feedback potentiometer in the circuit of Fig. 2. In other words, assuming a constant amplitude input signal, a constant amplitude and amplified output signal is realized, regardless of the position of the potentiometer slider 202. In addition, use of an output transformer is entirely optional in the case of the circuit of Fig. 3, depending primarily on the impedance of the load circuit connected thereto.

Under balanced conditions, it can be seen that this amplifier completely eliminates undesirable switching transients, since the direct current in the output tubes does not flow through bias compensating resistor 36. Under unbalanced conditions, the drop across resistance 36 tends to restore balance. In addition, the combined positive and negative feedback system used alomst completely eliminates major harmonic and inter-modulation distortion. The effective source impedance of the amplifier, which is presented to the output load coupled across the secondary of primary winding 150, can be made positive, zero, or even negative if desired.

While I do not desire to be limited to any specific circuit parameter or parameter values, such parameters and values varying in accordance with individual designs, the following circuit values have been found entirely satisfactory in a working model of the embodiment of the invention illustrated in Fig. 2:

*Power supply*

| | Volts |
|---|---|
| 29 | 400 |
| 32 | 400 |
| 43 | 60 |

*Tubes*

| | |
|---|---|
| 12 | ½6SN7 |
| 19 | 6L6 |
| 22 | ½6SN7 |
| 28 | 6L6 |
| 104 | ½6SN7 |
| 110 | ½6SN7 |
| 116 | ½6SN7 |
| 123 | ½6SN7 |

*Resistors*

| | | |
|---|---|---|
| 36 (50 watts) | ohms | 10,000 |
| 40 | do | 100,000 |
| 41 | do | 100,000 |
| 45 | do | 680,000 |
| 46 | do | 680,000 |
| 50 | do | 130,000 |
| 51 | do | 130,000 |
| 52 | do | 390 |
| 53 | do | 10,000 |
| 54 | do | 10,000 |
| 102 | megohm | 1 |
| 112 | ohms | 2,000 |
| 113 | do | 18,000 |
| 117 | megohms | 2 |
| 125 | ohms | 22,000 |
| 127 | do | 10,000 |
| 129 | do | 130,000 |
| 130 | do | 34,000 |
| 134 | do | 27,000 |
| 135 | do | 27,000 |
| 136 | do | 22,000 |
| 137 | do | 22,000 |
| 138 | do | 2,200 |
| 139 | do | 2,200 |
| 140 | megohms | 3 |
| 141 | do | 3 |
| 142 | ohms | 5,600 |
| 145 | do | 5,600 |
| 151 | do | 100 |
| 201 | do | 300,000 |
| 203 | do | 70,000 |
| 204 | do | 370,000 |
| 206 | megohm | .5 |

*Capacitors*

| | | |
|---|---|---|
| 13 | microfarad | .25 |
| 16 | do | .05 |
| 23 | do | .25 |
| 25 | do | .05 |
| 101 | do | .25 |
| 108 | do | .50 |
| 114 | do | .50 |
| 118 | micromicrofarads | 39 |
| 121 | do | .50 |
| 126 | microfarads | 10 |
| 128 | do | 8 |
| 147 | do | 50 |
| 143 | do | 50 |
| 144 | micromicrofarads | 20 |
| 146 | do | 20 |
| 200 | microfarad | .25 |

While there has been shown and described what at present is considered the preferred embodiment of the invention, it will be obvious to those skilled in the art that various changes and modifications may be made therein without departing from the invention as defined by the appended claims.

Having thus described my invention, I claim:

1. The combination of a source of push-pull signals, a bridge amplifier stage, and a high resistance, said bridge amplifier stage consisting of two electron tubes each having at least anode, cathode, and control electrodes, said bridge amplifier further consisting of two power supplies each having a negative and a positive terminal, the power supplies and tubes being arranged in a closed loop in which the tubes have their anode-cathode paths in series and in which each power supply has its negative terminal connected to the cathode of one tube and its positive terminal connected to the anode of the other tube, means for coupling the source of signals to said control electrodes, said high resistance having a center tap and being connected between the cathodes of said tubes and means for applying biasing potentials to the control electrodes of said tubes consisting of a pair of resistors serially connected between said control electrodes and a source of fixed biasing potential connected between said center tap and the junction of said resistors, whereby the total bias on each control electrode consists of the fixed potential provided by said potential source and the additional potential drop existing in that portion of the high resistance between the center tap and the cathode of the tube controlled thereby, so that statically unbalanced currents in said bridge amplifier due to differences in the conductivity characteristics of said tubes are compensated for by such potential drop.

2. The combination of a bridge amplifier stage and a high resistance load, said bridge amplifier stage consisting of two electron tubes each having at least anode, cathode, and control electrodes, said bridge amplifier further consisting of two power supplies each having a negative and a positive terminal, the power supplies and tubes being arranged in a closed loop in which the tubes have their anode-cathode paths in series and in which each power supply has its negative terminal connected to the cathode of one tube and its positive terminal connected to the anode of the other tube, said high resistance load having a center tap and being connected between the cathodes of said tubes, and means for applying biasing potentials to the control electrodes of said tubes including a source of biasing potential in circuit between said center tap and said control electrodes, whereby the total bias on each control electrode consists of the potential provided by said source and the additional potential drop existing in that portion of the high resistance load between the center tap and the cathode of the tube controlled thereby, so that statically unbalanced currents in said bridge amplifier due to differences in the conductivity characteristics of said tubes are compensated for by such potential drop.

3. The combination in accordance with claim 2 and a pair of capacitors coupled to the cathodes of said tubes for taking output therefrom without substantially decreasing the D. C. resistance of said load.

4. The combination of a source of push-pull signals, a bridge amplifier stage, and a high resistance load, said bridge amplifier stage consisting of two electron tubes each having at least anode, cathode, and control electrodes, said bridge amplifier further consisting of two power supplies each having a negative and a positive terminal, the power supplies and tubes being arranged in a closed loop in which the tubes have their anode-cathode paths in series and in which each power supply has its negative terminal connected to the cathode of one tube and its positive terminal connected to the anode of the other tube, means for coupling the source of signals to said control electrodes, said high resistance load being connected between the cathodes of said tubes and including two parallel resistors each having a center tap, and means for applying biasing potentials to the control electrodes of said tubes consisting of a pair of resistors serially connected between said control electrodes and a source of fixed biasing potential connected between a center tap and the junction of the last-named resistors, whereby the total bias on each control electrode consists of the fixed potential provided by said potential source and the additional potential drop existing in that portion of the load between such center tap and the cathode of the tube controlled thereby, so that statically unbalanced currents in said bridge amplifier due to differences in the conductivity characteristics of said tubes are compensated for by such potential drop.

5. The combination of a source of push-pull signals comprising a pair of driver tubes each having an anode, a cathode, and a control electrode, a bridge amplifier stage and a load, said bridge amplifier stage consisting of two electron amplifier tubes each having at least an anode, a cathode, and a control electrode, said bridge amplifier further consisting of two power supplies each having a negative and a positive terminal, the power supplies and amplifier tubes being arranged in a closed loop in which the amplifier tubes have their anode-cathode paths in series and in which each power supply has its negative terminal connected to the cathode of one amplifier tube and its positive terminal connected to the anode of the other amplifier tube, said load being connected between the cathodes of said amplifier tubes, means coupling the anode of each driver tube to the control electrode of the associated amplifier tube driven thereby, regenerative feedback means conductively connecting the anode of each amplifier tube to the anode of the non-associated driver tube, and degenerative feedback means conductively connecting the cathode of each amplifier tube to the cathode of the non-associated driver tube.

6. The combination of a source of push-pull signals comprising a pair of driver tubes each having an anode, a cathode, and a control electrode, a bridge amplifier stage and a load, said bridge amplifier stage consisting of two electron amplifier tubes each having at least an anode, a cathode, and a control electrode, said bridge amplifier further consisting of two power supplies each having a negative and a positive terminal, the power supplies and amplifier tubes being arranged in a closed loop in which the amplifier tubes have their anode-cathode paths in series and in which each power supply has its negative terminal connected to the cathode of one amplifier tube and its positive terminal connected to the anode of the other amplifier tube, said load being connected between the cathodes of said amplifier tubes, means for coupling the anode of each driver tube to the control electrode of the associated amplifier tube driven thereby, regenerative feedback means coupling the anode of each amplifier tube to the anode of the non-associated driver tube, and degenerative feedback means coupling the cathode of each amplifier tube to the cathode of the non-associated driver tube.

7. The combination of a source of push-pull signals comprising a pair of driver tubes each having an anode, a cathode, and a control electrode, a resistor connected between said cathodes, a bridge amplifier stage and a load, said bridge amplifier stage consisting of two electron amplifier tubes each having at least an anode, a cathode, and a control electrode, said bridge amplifier further consisting of two power supplies each having a negative and a positive terminal, the power supplies and amplifier tubes being arranged in a closed loop in which the amplifier tubes have their anode-cathode paths in series and in which each power supply has its negative terminal connected to the cathode of one amplifier tube and its positive terminal connected to the anode of the other amplifier tube, said load being connected between the cathodes of said amplifier tubes, means coupling the anode of each driver tube to the control electrode of the associated amplifier tube driven thereby, and degenerative feedback means connecting the terminals of the load to said resistor.

8. An electronic power amplifier comprising a first and a second electron discharge device each having an anode, a cathode, and a control electrode, a first and a second source of direct current energy each having a positive and a negative terminal, the positive terminal of one of said sources being connected to the anode of said first device, the cathode of said first device being connected to the negative terminal of said second source, the positive terminal of the other source being connected to the anode of said second device, and the cathode of said second device being connected to the negative terminal of said first source; and a load connected to the cathodes of said two devices, circuit means including driver tubes each having an anode for supplying the control electrodes of said devices with oppositely phased signal voltages, regenerative feedback means comprising conductive cross-connections between the anodes of said devices and the anodes of the driver tubes, and a feedback connection from said load to said circuit means.

References Cited in the file of this patent

UNITED STATES PATENTS

| | | |
|---|---|---|
| 1,601,070 | Horton | Sept. 28, 1926 |
| 2,510,347 | Perkins | June 6, 1950 |
| 2,644,136 | Mullins | June 30, 1953 |

U. S. DEPARTMENT OF COMMERCE

PATENT OFFICE

CERTIFICATE OF CORRECTION

Patent No. 2,817,718 December 24, 1957

Ronald J. Rockwell

It is hereby certified that error appears in the printed specification of the above numbered patent requiring correction and that the said Letters Patent should read as corrected below.

Column 5, line 39, for "resistance" read --resistances--; column 6, line 66, for "imepdance" read --impedance--; column 7, line 57, for "alomst" read --almost--; column 9, line 9, after "tubes" insert a comma.

Signed and sealed this 15th day of April 1958.

(SEAL)
Attest:

KARL H. AXLINE

Attesting Officer

ROBERT C. WATSON
Commissioner of Patents